United States Patent [19]
Mayer

[11] Patent Number: 4,752,455
[45] Date of Patent: Jun. 21, 1988

[54] PULSED LASER MICROFABRICATION

[75] Inventor: Frederick J. Mayer, Ann Arbor, Mich.

[73] Assignee: KMS Fusion, Inc., Ann Arbor, Mich.

[21] Appl. No.: 867,078

[22] Filed: May 27, 1986

[51] Int. Cl.⁴ .............................................. B23K 9/00
[52] U.S. Cl. ................................ 427/53.1; 219/121 L
[58] Field of Search ...................... 427/53.1, 147, 148; 219/121 L

[56] References Cited

U.S. PATENT DOCUMENTS 3,560,258  2/1971  Brisbane .
4,190,759  2/1980  Hongo et al. ............... 219/121 LM

FOREIGN PATENT DOCUMENTS 2113336  9/1971  Fed. Rep. of Germany ..... 427/53.1
2523982  12/1976  Fed. Rep. of Germany ..... 427/53.1
1118429  10/1984  U.S.S.R. ............................ 427/53.1

OTHER PUBLICATIONS

Roshon et al, "IBM Tech. Disc. Bull.", vol. 7, No. 3, p. 224, Aug. 1964.
von Gutfeld, "IBM Tech. Disc. Bull.", vol. 17, No. 6, pp. 1807–1808, Nov. 1974.
Coullahan et al, "IBM Tech. Disc. Bull.", vol. 22, No. 6, pp. 2279–2281, Nov. 1979.

Primary Examiner—John H. Newsome
Attorney, Agent, or Firm—Barnes, Kisselle, Raisch, Choate, Whittemore & Hulbert

[57] ABSTRACT

A system and method of pulsed-laser microfabrication wherein a first substrate of transparent material, such as glass, has one or more target materials positioned on a surface, preferably a flat surface, of the substrate. These target materials include a thin film of electrically conductive material—i.e., a conductor or semiconductor—immediately adjacent to the substrate surface. Pulsed laser energy is directed through the transparent substrate onto the conductive film at a sufficient intensity and for a sufficient duration to rapidly vaporize the metal film. The target materials are driven by film vaporization energy and by the reaction thereof against the glass substrate onto the opposing or object surface of a second substrate.

9 Claims, 3 Drawing Sheets

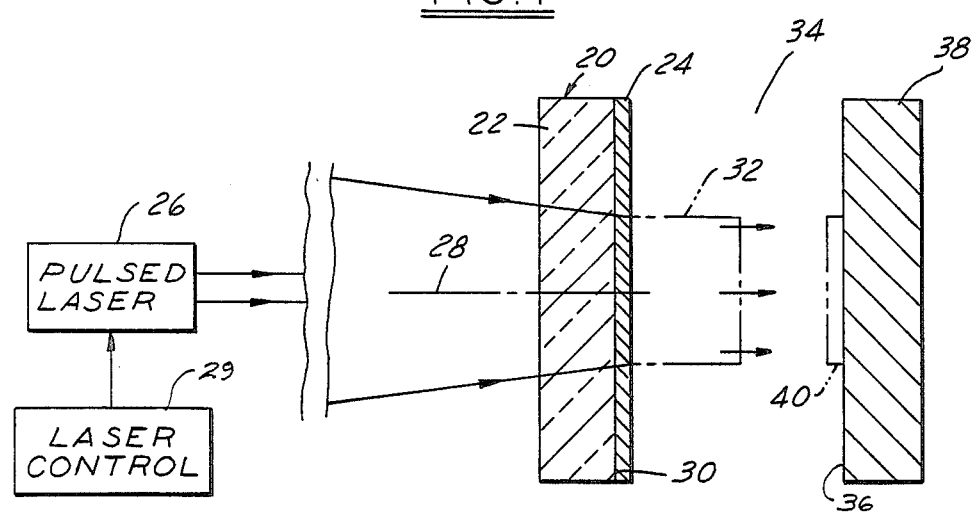
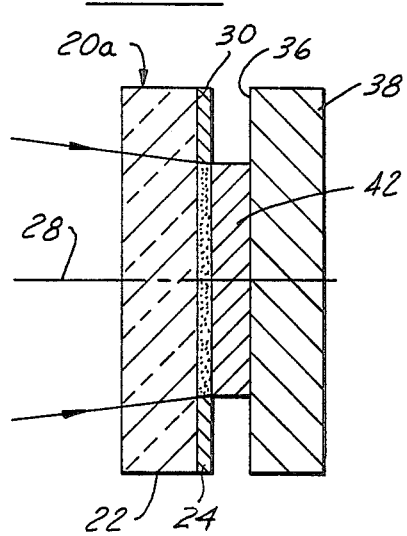
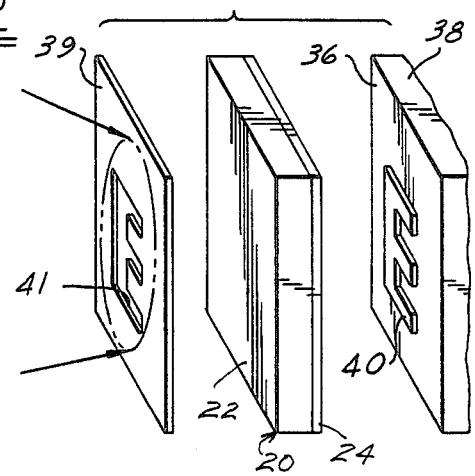
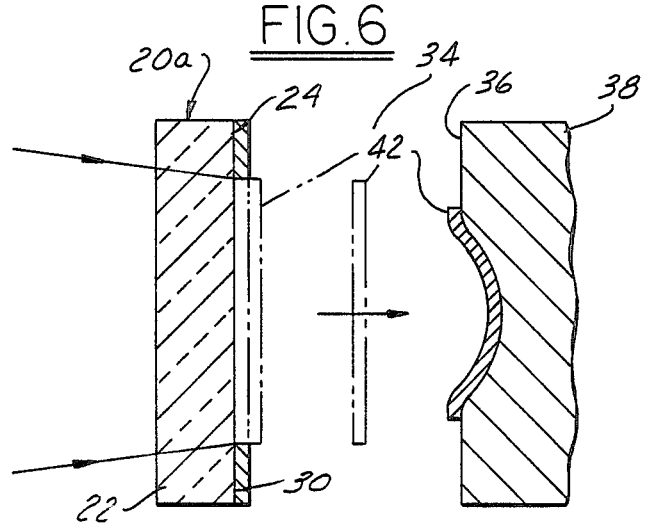

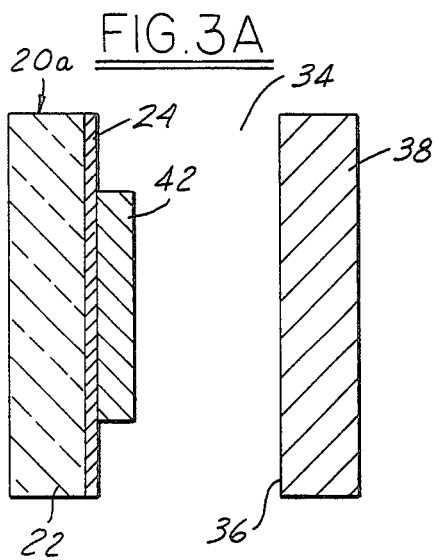
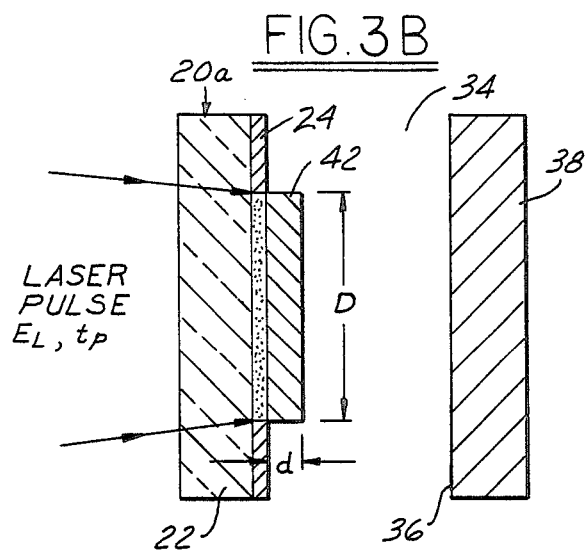
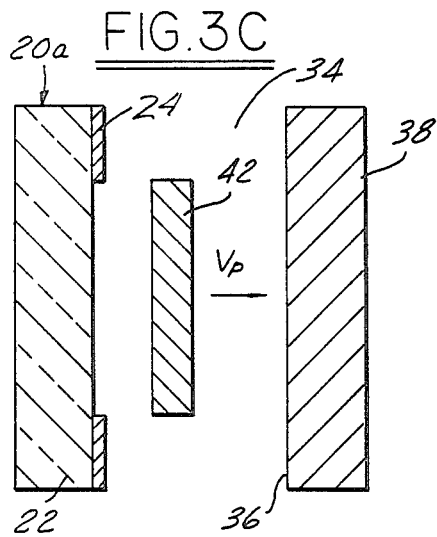
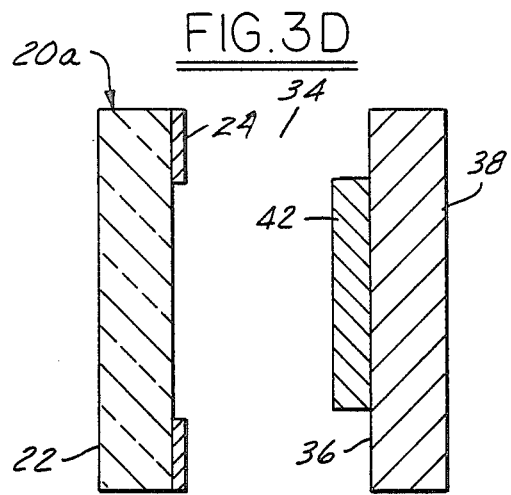
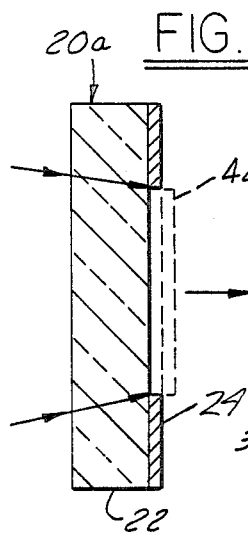
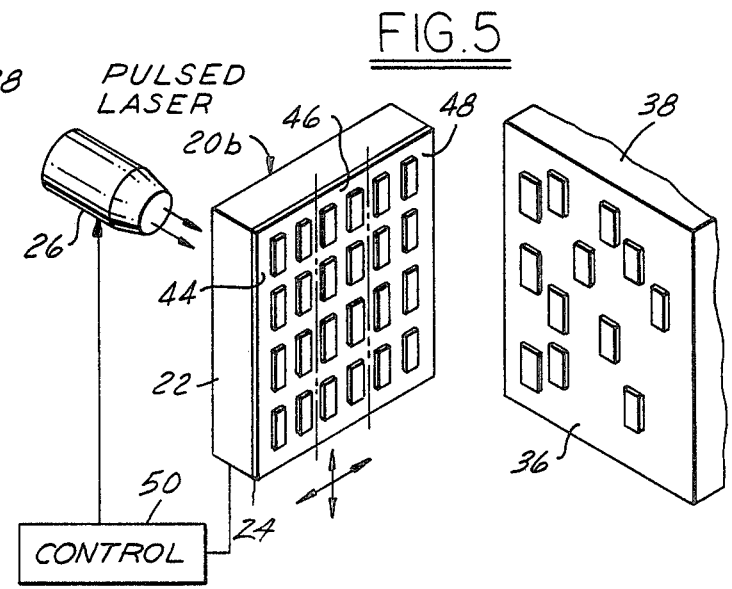

PULSED LASER MICROFABRICATION

The present invention relates to small-scale or micro-sized fabrication techniques of a type employed for integrated circuit manufacture, for example, and more particularly to use pulsed laser energy in such applications.

BACKGROUND OF THE INVENTION

It has heretofore been generally proposed to employ laser-initiated explosive energies in fabrication of integrated circuits. In Cranston U.S. Pat. No. 3,727,296, for example, small charges of explosive material, such as azide or fulminate explosives, are deposited on the free ends of integrated circuit leads which are cantilevered over a substrate. The explosive material is ignited by laser energy to propel the lead ends against the underlying substrate with sufficient force to bond the leads to the substrate. In order to detonate explosive materials, a minimum quantity of explosive is necessary. This minimum quantity is determined at least in part by the so-called deflagration to detonation distance, which is the distance required for an ignition shock front to propagate to explosive detonation. Thus, the technique proposed in Cranston is both difficult to control on the scale therein disclosed, and is not amenable to use on a smaller scale, such as in fabrication of the integrated circuits themselves. There is also a problem of explosion by-products.

Frish et al, "Surface Coating and Alloying by Laser Induced Heat and Pressure," Final Report, NSF Grant No. DMR-8260087 (May 1983) and "Metal Bonding with High Intensity Laser Pulses," SPIE Proceedings, Vol. 458 (Jan. 1984) propose bonding metal foils to substrates of dissimilar metal by placing the foil in contact with the substrate and then irradiating the foil surface remote from the substrate with a laser pulse so as to ablate a portion of the foil surface. Thermal and pressure waves are generated in the foil and travel through the foil thickness at differing velocities. If the thermal wave reaches the foil/substrate interface during irradiation, both materials will melt and thereafter mix under the influence of the laser-induced pressure gradients. Thus, the disclosed "laser stamping" technique makes use of both heat and pressure supplied to the foil by the high intensity laser pulse.

Drew et al T988007 (1979) discloses a laser vapor deposition technique wherein a CW laser beam is directed through a transparent substrate onto a reservoir of metal on the opposite side of and spaced from the substrate. The laser beam heats and vaporizes the metal of the reservoir, which is then redeposited on the opposing surface of the substrate.

Mayer et al, "Plasma Production by Laser-Driver Explosively Heated Thin Metal Films," J. App. Phys., 57, February 1985, pp 827–829, discloses a technique for producing metal vapor clouds or plasmas for studying laser/plasma interactions. A thin metal film on the surface of a glass substrate is irradiated by a short laser pulse directed through the substrate. The laser energy is absorbed by classical skin-depth absorption to rapidly heat and "explode" the film from the substrate preferentially along an axis perpendicular to the substrate surface. A high-power second laser beam is thereafter directed into the resulting metal vapor plasma to heat the plasma and thereby provide opportunity for controlled study of laser/plasma interactions.

OBJECTS AND SUMMARY OF THE INVENTION

It is a general object of the present invention to provide improved microfabrication techniques having utility in manufacture of integrated circuits and like applications.

A further object of the invention is to provide improved techniques of the described character which employ conventional pulsed laser technology.

Another and yet more specific object of the invention is to provide a method for depositing, bonding and/or forming materials on a substrate employing pulsed laser microexplosions, and a system for performing such a method.

In accordance with the preferred embodiments of the invention herein disclosed, a first substrate of transparent material, such as glass, has one or more target materials positioned on a surface, preferably a flat surface, of the substrate. These target materials include a thin film of electrically conductive material—i.e., a conductor or semiconductor—immediately adjacent to the substrate surface. Pulsed laser energy is directed through the transparent substrate onto the conductive film at a sufficient intensity and for a sufficient duration to rapidly vaporize the metal film. The target materials are propelled by film vaporization energy and by the reaction thereof against the glass substrate onto the opposing or object surface of a second substrate. In various embodiments of the invention herein disclosed, the object surface of the second substrate is either spaced from the target materials on the first substrate, whereby film vaporization energy explosively propels the target materials across the intervening gap or space. Alternatively, the first substrate, target material and second substrate are in sandwiched contact, whereby the vaporized film is restrained from explosion, and the target materials are bonded to the object surface of the second substrate by interaction of temperature and pressure at the object surface.

In one embodiment of the invention, the exploding vapor is deposited as a coating or layer onto the spaced opposing surface of the second substrate, thereby providing an improved laser vapor deposition technique. Due to site selectivity of the laser vaporization, coupled with the uniform geometry of the exploding vapor cloud, this laser vapor deposition technique may be employed for controlled deposition of conductive films of complex and intricate geometries. In a second embodiment of the invention, a flyer section of material carried by the conductive film is propelled intact by film vaporization energy across the intervening gap against the opposing surface of the second substrate. When sufficient energy is imparted to the flyer section, the latter is bonded by impact to the opposing surface of the second substrate. In one application of this embodiment, ohmic contacts are selectively bonded to GaAs semiconductor substrates. A lesser amount of vaporization energy causes the flyer section to conform to the surface contour of the second substrate without bonding thereto, thereby providing a process for forming of micro-sized articles of desired contour.

GENERAL DESCRIPTION OF THE DRAWINGS

The invention, together with additional objects, features and advantages thereof, will be best understood from the following description, the appended claims and the accompanying drawings in which:

FIG. 1 is a schematic diagram of a first embodiment of the invention;

FIG. 2 is a schematic diagram of an application of the laser vapor deposition process illustrated in FIG. 1;

FIGS. 3A–3D are schematic illustrations of a second embodiment of the invention at successive stages of operation;

FIG. 4 is a schematic diagram of an application of the laser bonding process illustrated in FIGS. 3A–3D;

FIG. 5 is an exploded schematic diagram of a second application of the process of FIGS. 3A–3D;

FIG. 6 is a schematic diagram of a third embodiment of the invention for impact-forming of micro-sized articles;

FIG. 9 is a schematic diagram of yet another embodiment of the invention.

DETAILED DESCRIPTION OF PREFERRED EMBODIMENTS

Figure 7:
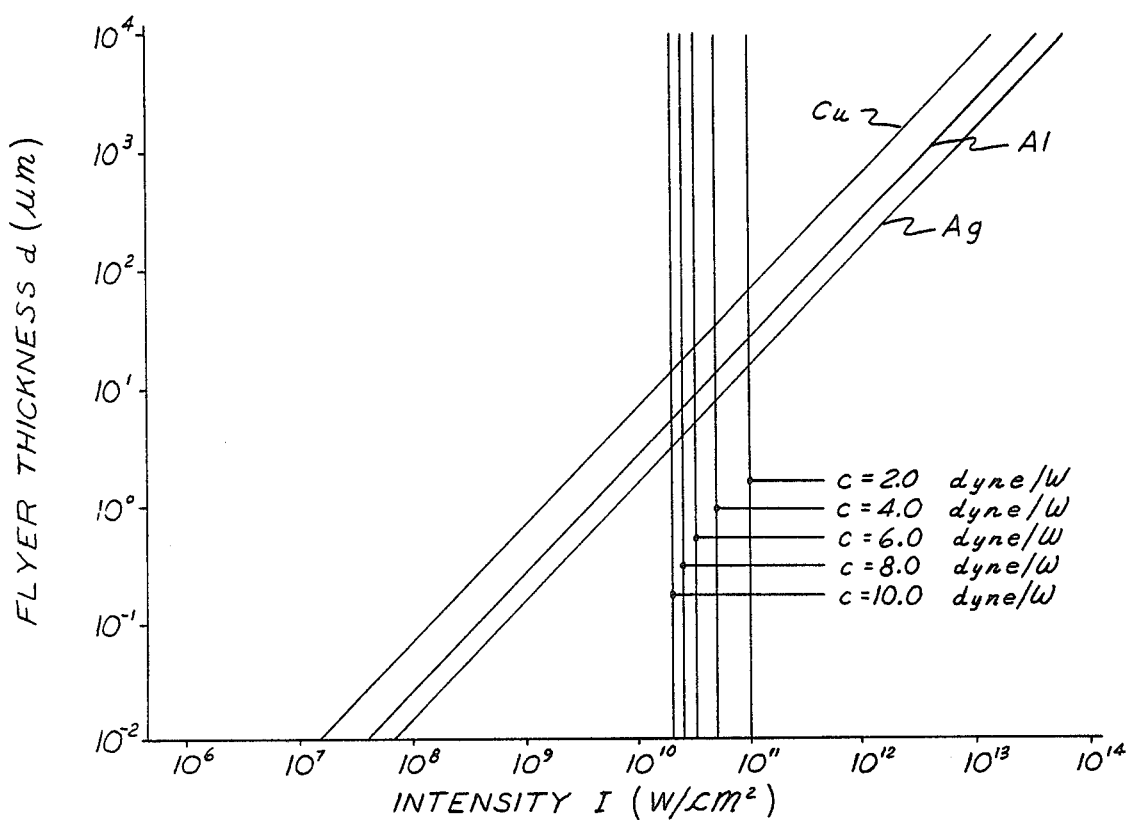
FIGS. 7–8 are graphic illustrations useful in discussing operation of the embodiment of FIGS. 3A–3D.

FIG. 1 illustrates a first embodiment of the invention as including a laser target 20 comprised of a flat transparent substrate 22 having a thin film 24 of electrically conductive material deposited on one surface thereof. Energy from a pulsed laser 26 coupled to a suitable laser control 29 is focused through substrate 22 onto film 24 on a axis 28 which is substantially normal to the film-/substrate interface 30. That portion of film 24 which is illuminated by laser 26 is rapidly heated and vaporized by the laser energy deposited therein. The resulting vapor cloud 32 "explodes" preferentially along axis 28 on a uniform substantially cylindrical vapor front (assuming a circular laser beam) across a gap 34 onto the target surface 36 of an opposing substrate 38, where the exploded film plasma is vapordeposited as at 40.

As noted above, film 24 is of electrically conductive material, including both conductors and semiconductors having carrier concentrations in excess of about $10^{17} cm^{-3}$. Aluminum, gold and nickel are examples of suitable metallic conductors, and impurity-doped silicon and germanium are examples of suitable semiconductors. The thickness of film 24 is coordinated with the intensity and duration of the pulsed output of laser 26 focused thereon to obtain rapid and complete vaporization of the film material. More specifically, thickness of film 24 is chosen to be approximately equal to the thermal diffusion depth L expressed by Equation (7) (see Equation Appendix), where k is the thermal conductivity of the film material, $C_v$ is the specific heat per unit mass, rho-1 is the density of the film material and $t_p$ is the laser pulse duration. In general, pressure at vaporization increases with intensity and film thickness. Laser energy is deposited by classical skin/depth absorption, and foil thickness should be at least equal to skin depth for a given laser energy and foil material to obtain desired efficiency. Pulse duration should be no more than is needed to obtain complete vaporization at desired intensity and film thickness.

By way of example only, target 20 may comprise a glass substrate 22 having a thickness of 1 mm. Film 24 of aluminum may be deposited on substrate 22 by any suitable vapor deposition or other technique and possess a thickness in the range of $10^2$ to $10^4$ A. Laser intensities of $10^9$ to $10^{12}$ W/cm$^2$ at a pulse duration of between $10^{-10}$ and $10^{-8}$ sec would heat the illuminated section of film 24 to a temperature of between 2000° and 100,000° K. The resulting pressure at interface 30 would be up to the order of a few hundred kilobars. Gap 34 may range in length between zero (direct contact between film 24 and target surface 36) and a few millimeters. In general, using a substrate 22 of glass construction, laser 26 has a wavelength (nominal) in the visible or near-infrared regions of the spectrum. Long-wavelength pulsed lasers may also be employed, provided of course that substrate 22 is of a construction that transmits energy at the wavelength chosen.

FIG. 2 illustrates an application of the laser-explosive vapor deposition technique of FIG. 1 for selective pattern deposition onto substrate 38. A mask 39 having the desired deposition pattern 41 stencilled therein is positioned to intersect the laser beam, allowing only a portion of the laser energy corresponding to pattern 41 to be focused onto target 20. Because of the inherent site selectivity of the vaporization process, coupled with the uniformity in the expanding vapor front 32 (FIG. 1) noted in practice of the invention, the resulting pattern 40 on substrate 38 conforms quite closely to pattern 41 in mask 39.

FIGS. 3A–3D schematically illustrate a second embodiment or application of the invention for bonding a workpiece section of material onto surface 36 of substrate 38. The target 20a of FIG. 3A includes a workpiece section or "flyer" 42 deposited or otherwise disposed on film 24. The periphery of flyer 42 corresponds to the focused periphery of the laser beam at film 24, e.g. circular, so that the portion of film 24, and only that portion of film 24, sandwiched between flyer 42 and substrate 22 is vaporized. Pulsed laser energy at intensity $E_L$ and duration $t_p$ (FIG. 3B) is focused through substrate 22 onto film 24 and vaporizes the film as previously described. The exploding force of the vaporized film propels flyer 42 across gap 34 at velocity $V_p$ (FIG. 3C) against substrate surface 36 (FIG. 3D) with sufficient force than an impact bond is formed at the interface.

For explosive bonding to occur, it is necessary that flyer velocity $V_p$ be between predetermined limits which vary with flyer and substrate materials. Table I (see Appendix) indicates minimum and maximum velocities $V_p$ for bonding to occur between a flyer 42 and substrate 38 of exemplary identical metals. Assuming that all energy of the vaporized film is transferred to flyer 42, the kinetic energy $E_k$ of the flyer may be expressed by Equation (1), where epsilon is efficiency of laser energy transfer to flyer 42, rho-2 is density of the flyer material, d is thickness of flyer 42 and D is flyer diameter (FIG. 3B). Equation (1) can be rearranged as shown in Equation (2). The intensity I of incoming laser energy can be expressed as shown in Equation (3), where it is assumed that the diameter of focused laser energy at film 24 is equal to the diameter D of flyer 42. Vapor pressure P at film 24 is given by Equation (4), where c is a coupling coefficient. In tests, laser intensities on the order of $10^{11}$ W/cm$^2$ having a pulse duration $t_p$ of $10^{-10}$ sec were sufficient to vaporize films of Al having a thickness of 1000 A to produce a pressure P of 200 kbar. The constant epsilon was observed to be about 0.1, and the constant c was taken to be about 2.0 dyne/W.

Substituting Eq (3) into Eq (4) yields Equation (5). Substituting Eq (2) into Eq (5) yields Equation (6). For a given combination of materials for flyer 42 and substrate 38, rho-2, $V_p$-max and $V_p$-min are fixed. For a particular laser, c and epsilon are constants. Thus, pressure P, thickness d and pulse duration $t_p$ can be determined per Eq (6). For given thickness d, a variety of laser energies $E_L$ and diameters D are available, as shown by Eq (1).

Figure 8:
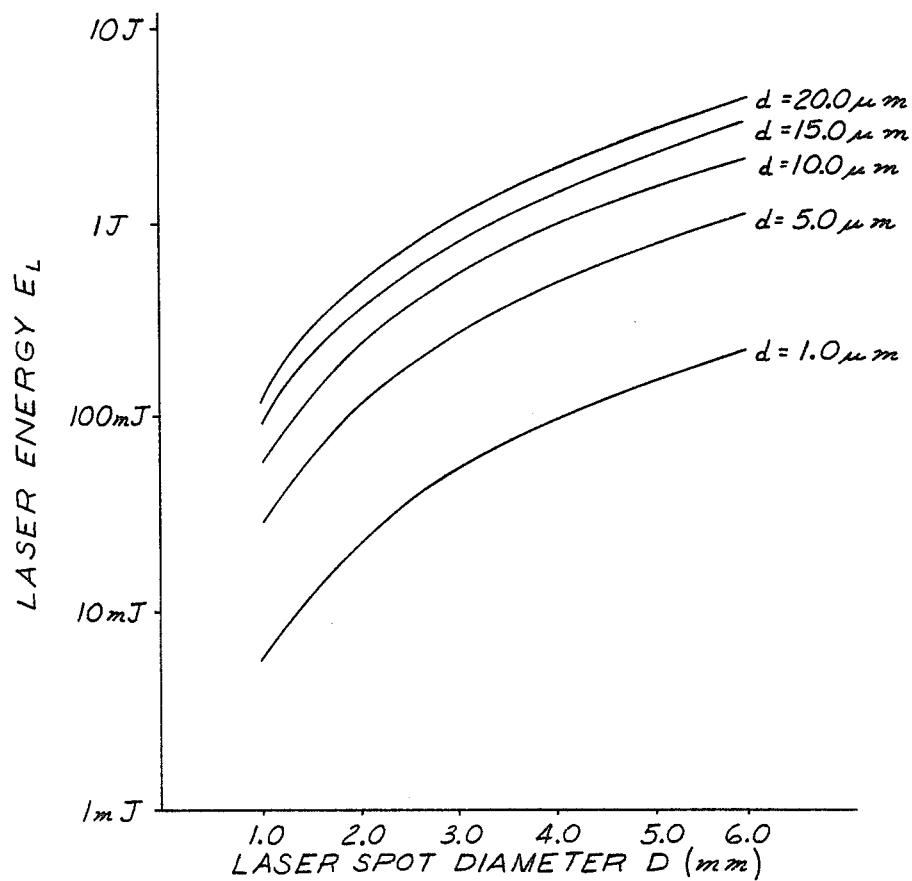

FIG. 7 is a graph which illustrates laser intensity I as a function of flyer thickness d required to give velocity $V_p$-max (Table I) for Al, Ag and Cu. The constant epsilon is taken as 0.1, and the pulse duration $t_p$ is $10^{-10}$ sec. (Lesser values of epsilon move the curves to right.) The vertical lines represent differing values of c. Bonding will occur for the different combinations of I and d for each material plot which lie to the right of the intersections with the appropriate value of c. FIG. 8 is a graph which illustrates laser energy $E_L$ versus diameter D for differing thicknesses d of a flyer 42 of silver composition at c equal to 2.0 dyne/W, epsilon equal to 0.1 and $t_p$ equal to 100 psec. The foregoing discussion assumes that film 24 is normal to axis 28 (FIG. 1). For other angles, the area of the focused laser energy is increased, and intensity is correspondingly decreased, as trigonometric functions of angle.

FIG. 4 illustrates an important application of the laser explosive bonding technique of FIGS. 3A-3D. A known problem in the fabrication of gallium-arsenide semiconductors lies in deposition of ohmic contacts. Contact conductors deposited by vapor deposition or other typical conventional techniques do not exhibit good adhesion to the semiconductor substrate, and also may exhibit high contact resistance. In the illustration of FIG. 4, a flyer 42 is explosion-bonded to form a conductive contact on semiconductor substrate 38 over surface 36 which would typically be an insulating layer. It will be appreciated that the application of FIG. 4 may be employed for repair of a damaged conductive strip 36. FIG. 5 illustrates a further application of the laser explosion bonding technique of the invention. The target 20b in FIG. 5 comprises a glass substrate 22 having the film 24 deposited thereon. Target 20b is effectively divided into three zones or sections 44, 46, 48 having spots or flyers of differing materials, such as Al, Si and C, deposited onto film 24. By jogging target 20b using a suitable control 50, a semiconductor can be manufactured by selective deposition and build-up of Al, Si and C zones on the substrate 38. FIG. 6 illustrates a modification to the embodiment of FIGS. 3A-3D. By employing reduced laser energy, flyer velocity can be reduced so that flyer 42 is formed against, but not bonded to, the contour of substrate 38.

FIG. 9 illustrates a modification to the embodiment of FIGS. 3A-3D wherein the gap or space 34 is reduced to zero. That is, in the embodiment of FIG. 9, target 20a is positioned with workpiece 42 (not a "flyer" in this application) in facing abutment with object surface 36. When film 24 beneath workpieces 42 is vaporized, substrate 22 cooperates with substrates 38 and workpiece 42 to confine the vapor energy. The process of FIG. 9 has been tested with good results in bonding aluminum workpieces 42 to substrates 38 of silicon and copper compositions. Bonding was observed for laser intensities I ranging from $1.0-9.0 \times 10^9 W/cm^2$ and duration $t_p$ equal to $10^{-9}$ sec. Thickness d was equal to one micron. The bonding process formed films with the best surface morphologies when performed in at least a rough vacuum (25-70 millitorr). This was observed in the Al—Si tests in which large contiguous films were bonded. The Al—Cu tests, not performed in vacuum, showed a clumpier less contiguous film deposition. The surface morphology of the vacuum tests were not as good as control films produced by conventional vapor deposition, which was probably due in major part to large transverse spatial variations in the laser intensity observed in the text. Adhesion testing of the laser-bonding films demonstrated a great increase in adhesive strength over conventional vapor-deposited films.

SEM observation of the film-substrate interface of the Al—Cu targets showed significant intermixing of the two metals. In some cases, a wavy type interface was observed, which is typical of large scale explosive bonding bonds. The intermixing probably accounts for the observed adhesive strength of the laser-bonded films. Optical microscopy of the Al—Si interfaces provided evidence of long contiguous film bonding. SEM observation of the interface was less conclusive. This was in part due to the imaging difficulty in discriminating between the Al and Si. Also, melting and mixing may have occured, eliminating a discrete interface between the two. In the application of FIG. 9 with workpiece 42 in direct contact with substrate 38, consideration must be given to the role of heat transfer to the bonding process. It is possible that the incident laser pulse induced a temperature profile in which melting temperatures were exceeded to a certain depth, possibly into the substrate. Indeed, empirical calculations indicate that, given the laser parameters and materials involved in these tests, the temperature at the interface between workpiece 42 and substrate 38 exceeded the melting temperatures of both, suggesting that melting and rapid interdiffusion of atoms under pressure may have played a significant role in the bonding process.

TABLE I

| | | Appendix | |
| Metal | Density ($g/cm^3$) | $V_p$ — min (m/s) | $V_p$ — max (m/s) |
| --- | --- | --- | --- |
| Al | 2.71 | 182 | 541 |
| Ag | 10.49 | 105 | 370 |
| Cu | 8.91 | 70 | 187 |
| 304SS | 7.90 | 271 | 282 |

$$E_k = \epsilon E_L = \tfrac{1}{2} m V_p^2 \qquad (1)$$

$$= \epsilon E_L = \tfrac{1}{2} \rho_2 d \frac{\pi D^2}{4} V_p^2$$

$$\frac{4 E_L}{\pi D^2} = \frac{\rho_2 d V_p^2}{2\epsilon} \qquad (2)$$

$$I = \frac{4 E_L}{t_p \pi D^2} \qquad (3)$$

$$P = cI \qquad (4)$$

$$P = \frac{c 4 E_L}{t_p \pi D^2} \qquad (5)$$

$$P = \frac{c}{t_p} \frac{\rho_2 d V_p^2}{2\epsilon} \qquad (6)$$

$$L = \left( \frac{2k}{C_V \rho_1} t_p \right)^{\tfrac{1}{2}} \qquad (7)$$

I claim:
1. A method of propelling a workpiece against an object surface comprising the steps of:
   (a) providing a target comprising a first substrate transparent to laser energy, a film of electrically conductive material on a surface of said substrate, and a workpiece separate from and carried by said film and spaced by said film from said substrate surface, (b) positioning said object surface on a side of said workpiece remote from said substrate surface, and (c) directing pulsed laser energy through said substrate onto said film beneath said workpiece to vaporize said film beneath said workpiece while leaving said workpiece intact, such that energy of vaporization of said film beneath said workpiece drives said workpiece against said object surface.

2. The method set forth in claim 1 wherein said step (b) comprises the step of positioning said object surface in facing abutment against said workpiece.

3. The method set forth in claim 1 wherein said step (b) comprises the step of positioning said object surface spaced by a gap from said workpiece, such that said vaporization energy explosively propels said workpiece across said gap against said object surface.

4. The method set forth in claim 3 wherein said workpiece and said object surface are selected of predetermined compositions characterized by predetermined maximum and minimum impact velocities for explosive bonding to occur therebetween, and wherein said pulsed laser energy $E_L$ is given by Equation (1) of the specification, where epsilon is efficiency of laser energy transfer to said workpiece, rho-2 is density of said workpiece, d is thickness of said workpiece, D is diameter of said workpiece and $V_p$ is velocity between said maximum and minimum velocities.

5. The method set forth in claim 1 wherein said film is constructed of material having an electrical carrier concentration in excess of about $10^{17} cm^{-3}$.

6. The method set forth in claim 5 wherein said film is constructed of material selected from the group consisting of metallic conductors and semiconductions.

7. The method set forth in claim 6 wherein said film is of uniform thickness L given by Equation (7) of the specification, where k is thermal conductivity of said film, $C_v$ is specific heat per unit mass of said film, rho-1 is density of said film and $t_p$ is pulse duration of said pulsed laser energy.

8. A method of bonding a workpiece against an object surface comprising the steps of:

(a) providing a target comprising a first substrate transparent to laser energy, a film of electrically conductive material on a surface of said substrate, and a workpiece carried by said film and spaced by said film from second substrate energy, (b) positioning said object surface on a side of said workpiece remote from said substrate surface and in facing abutment against said workpiece, and (c) directing pulsed laser energy through said substrate onto said film beneath said workpiece to vaporize said film beneath said workpiece, such that energy of vaporization of said film beneath said workpiece drives said workpiece against said object surface for bonding said workpiece thereto.

9. A method of laser microfabrication comprising the steps of:

(a) providing a target comprising a transparent substrate having a flat surface and a target material including a film of electrically conductive material on said surface, said film having an electrical carrier concentration in excess of about $10^{17} cm^{-3}$, being constructed of material selected from the group consisting of metallic conductors and semiconductors, and possessing a uniform thickness L given by Equation (7) of the specification, where k is thermal conductivity of said film, $C_v$ is specific heat per unit mass of said film, rho-1 is density of said film and $t_p$ is pulse duration of said pulsed laser energy, (b) positioning an object surface on a side of said target remote from and in opposition to said substrate surface and substantially parallel thereto, and (c) directing pulsed laser energy through said substrate onto said film along an axis substantially normal to said substrate surface and having sufficient energy to vaporize said film, such that vaporization energy of said film and reaction thereof against said substrate surface drives said target material against said object surface.

* * * * *